(12) United States Patent
Toda et al.

(10) Patent No.: US 6,184,544 B1
(45) Date of Patent: Feb. 6, 2001

(54) SEMICONDUCTOR LIGHT EMITTING DEVICE WITH LIGHT REFLECTIVE CURRENT DIFFUSION LAYER

(75) Inventors: Hidekazu Toda; Shinji Isokawa, both of Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/221,837

(22) Filed: Dec. 29, 1998

(30) Foreign Application Priority Data

Jan. 29, 1998 (JP) .................................................. 10-055662
Jan. 30, 1998 (JP) .................................................. 10-055661

(51) Int. Cl.[7] ..................................................... H01L 33/00
(52) U.S. Cl. .............................. 257/98; 257/99; 257/100; 257/103
(58) Field of Search ................................. 257/98, 99, 100, 257/103; 362/800, 296, 341

(56) References Cited

U.S. PATENT DOCUMENTS 5,889,295 * 3/1999 Rennie et al. ........................... 257/99
6,034,712 * 3/2000 Iwasaki .................................. 438/27

FOREIGN PATENT DOCUMENTS 9-283803    10/1997   (JP) .

* cited by examiner

*Primary Examiner*—Minh Loan Tran
(74) *Attorney, Agent, or Firm*—Sughrue, Mion, Zinn, Macpeak & Seas, PLLC

(57) ABSTRACT

The LED element is die-bonded on the wiring pattern on the surface of the first white substrate facing to the cavity of the second white substrate by using electrically conductive materials as bonding material so that the LED element is accommodated in the cavity of the second white substrate and the p and n side electrodes on one side opposite to the light emitting surface of the sapphire substrate of the LED element are electrically connected with the through-hole conductors. The LED element which is die-bonded on the first white substrate is covered and sealed on its entire periphery with a light transmittable synthetic resin molded portion. The semiconductor light emitting device may have an enhanced light emission efficiency and can be formed in the flat form.

6 Claims, 1 Drawing Sheet

SEMICONDUCTOR LIGHT EMITTING DEVICE WITH LIGHT REFLECTIVE CURRENT DIFFUSION LAYER

BACKGROUND OF THE INVENTION

1. Field of the invention

The present invention relates to a semiconductor light emitting device in which its cost is reduced, and the light emission efficiency is improved and which is made thin. U.S. patent application 09/221,838 entitled Light Emitting Diode Element and U.S. patent application 09/221,839 entitled Semiconductor Light Emitting Device both naming the inventors Hidekazu Toda and Shinji Isokawa. and both filed on the same day as the present application and incorporated herein by references.

2. Description of the Related Art

Semiconductor light emitting device of the surface mount type using light emitting elements have been used for various industrial and consumer's apparatuses.

An example of such a prior art semiconductor light emitting device will be described with reference to FIG. 1.

The semiconductor light emitting device which is disclosed in Japanese Laid-open Patent Publication No. 9-283803 is also known other than that shown in FIG. 1.

FIG. 1 is a sectional view showing a semiconductor light emitting device 11 using a light emitting diode element (hereinafter abbreviated as LED element) as a semiconductor light emitting element.

In FIG. 1, a reference numeral 1 denotes a rectangular insulating substrate made of an electrically insulating material such as ceramics or non-transparent synthetic resin, which is coated with a pair of metallized wiring layers 2, 3 leading from the bottom of the rectangular insulating substrate 1 to it upper surface via its lateral side thereof. The LED element 6 is formed with a light emitting layer by the vapor phase growth of a nitride compound such as GaN on a sapphire substrate 6a and is formed with p and n side electrodes on one side thereof facing to the rectangular insulating substrate 1.

A reference numeral 7 denotes a reflector which is formed with a cavity 7a for accommodating the LED element 6. The reflector 7 is molded from a substrate of non-transparent synthetic resin to have a predetermined thickness. The cavity 7a is coated on its lateral side with a reflective coating to form a reflective layer. The reflector 7 is laminated on the rectangular insulating substrate 1 with a via bonding layers 9, 10.

Electrically conductive materials 4, 5 are bonded on the surface of respective metallized wiring layers 2, 3. The LED element 6 is die-bonded on the rectangular insulating substrate 1 by using electrically conductive materials 4, 5 as bonding material so that the LED element 6 is accommodated in the cavity 7a of the reflector 7 and the p and n side electrodes on one side 6a of the LED element 6 are electrically connected with a pair of metallized wiring layers 2, 3. A reference numeral 8 denotes a molded portion made of a transparent or semi-transparent synthetic resin, that is a light transmittable synthetic resin molded portion which covers the entire surface of the LED element 6 for sealing it.

The thus formed semiconductor light emitting device 11 comprising the LED element 6 which is die-bonded on the rectangular insulating substrate 1 is surface-mounted on a circuit board. The metallized wiring layers 2, 3 made of an electrically conductive material are connected to wiring conductors formed on the circuit board.

The output light which is emitted from the surface of the sapphire substrate 6b of the semiconductor light emitting element 6 is transmitted through the molded portion 8 and then emitted externally. A part of the output light is reflected on the side of the cavity 7a of the reflector 7. The reflected light is also transmitted through the molded portion 8 is emitted externally so that the light emission efficiency of the semiconductor light emitting device 11 is enhanced.

Since the reflective coating material is applied on the side wall of the cavity which is formed from the substrate of non-transparent synthetic resin to improve the light emitting efficiency in the prior art semiconductor light emitting device in such a manner, there is a problem that man-hour is increased thereby to increase the manufacturing cost. The output light which is emitted in a direction opposite to the light emitting face of the semiconductor light emitting device is considerably lost so that it is not effectively used.

Since the reflector of another member which is formed into a predetermined thickness is laminated on the insulating substrate, the thickness of the reflector may be larger than a necessary thickness even if the thickness of the semiconductor light emitting element is made thinner. This results in that the semiconductor light emitting device has a large elevational size T1.

SUMMARY OF THE INVENTION

The present invention is made to overcome such problems. It is an object of the present invention to provide a semiconductor light emitting device in which its manufacturing cost is reduced, and the light emission efficiency is improved and which is made in the thin form to reduce its size and weight and to provide a semiconductor light emitting device having an increased light emission efficiency by using, for example, a semiconductor (LED) having a high light emission efficiency which is described in Copending Japanese Patent Application No. 10-55662 incorporated herin by reference.

The above-mentioned objects are accomplished by semiconductor light emitting devices as follows:

1. A semiconductor light emitting device comprising first reflective substrate, a second reflective substrate having a cavity which is laminated on said first reflective substrate, a semiconductor light emitting element which is accommodated in said cavity of said second reflective substrate and is die-bonded on said first reflective substrate on the side opposite to the light emitting side, where p and n side electrodes are formed; and a light transmittable synthetic resin molded portion for sealing the semiconductor light emitting element.

2. A semiconductor light emitting device set forth in the paragraph 1, in which said semiconductor light emitting element may be die-bonded on a wiring pattern on the surface of said first reflective substrate facing to the cavity of said second reflective substrate so that the electrodes on the side opposite to the light emitting face of said semiconductor light emitting element are electrically connected to through-hole conductors on said first reflective substrate.

3. A semiconductor light emitting device set forth in the paragraph 1, in which said semiconductor light emitting element at least may comprise a sapphire substrate, a GaN based compound semiconductor layer including a light emitting layer laminated on said sapphire substrate, and a current diffusion film laminated on said semiconductor layer, and wherein said current diffusion film is made of an electrically conductive metal having a high light reflectance, and wherein said semiconductor light emitting element is mounted on said first reflective substrate so that an output light of the light emitting layer is emitted from the sapphire substrate together with the reflected light which is reflected on said current diffusion film.

4. A semiconductor light emitting device set forth in the paragraph 1 or 2, in which said first and second reflective substrate may be white substrates.

Since the second white (reflective) substrate which is formed with the cavity is laminated on the first white substrate and the semiconductor light emitting element is accommodated in the cavity of the second white substrate in accordance with the present invention, the output light emitted from the semiconductor light emitting element is also reflected on both the lateral side of the semiconductor light emitting element and its bottom side opposite to its light emitting face and is externally emitted. The light emission efficiency of the semiconductor light emitting device can be improved.

Since the first and second white substrates themselves are used as reflective layers for the output light emitted from the semiconductor light emitting element, necessity to form an additional reflective layer is eliminated so that the manufacturing cost can be reduced. The semiconductor light emitting device can be formed in the flat form by selecting the thickness of the second white substrate depending upon the thickness of the semiconductor sight emitting device. Accordingly, reduction in size and weight of the device can be achieved.

DESCRIPTION OF THE PREFERRED EMBODIMENT

Figure 1:
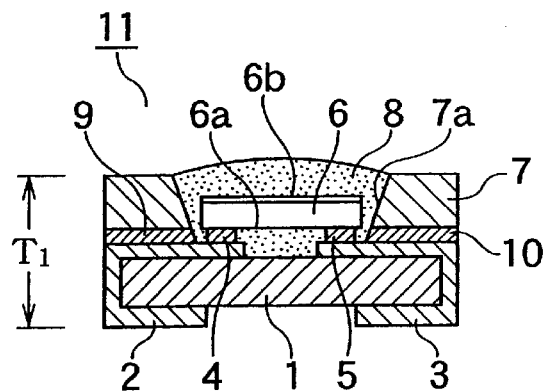
FIG. 1 is a sectional view showing the prior art semiconductor light emitting device.
Figure 2:
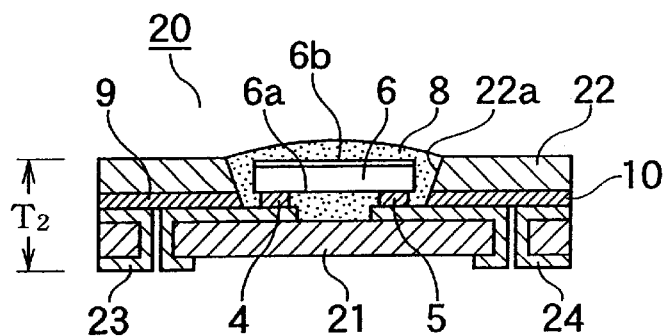
FIG. 2 is a sectional view showing an embodiment of the semiconductor light emitting device of the present invention.

Now, an embodiment of the present invention will be described with reference to FIG. 2. FIG. 2 is a sectional view showing a semiconductor light emitting device 20. Components which are identical with or similar to those in FIG. 1 are represented by like reference numerals. Description of them will be omitted. A semiconductor light emitting device 20 may use an LED element 6 having the same structure as that in FIG. 1.

In FIG. 2, a first white substrate 21 has a given wiring pattern formed on its reverse side and through-hole conductors 23, 24 extending through the through-holes to its surface. The first white substrate is made of a synthetic resin substrate.

A reference numeral 22 denotes a second white substrate which is formed with a cavity 22a and is made of same synthetic resin material as that of the first substrate 21. The second white substrate 22 is laminated on the first white substrate 21 by bonding with bonding materials 9, 10. The thickness of the second white substrate 22 is determined in consideration of mechanical strength, etc. depending upon the thickness of the semiconductor light emitting element. Accordingly, the size in elevation T2 of the semiconductor light emitting device 20 can be decreased.

The LED element 6 is die-bonded on the wiring pattern on the surface of the first white substrate 21 facing to the cavity 22a of the second white substrate 22 by using electrically conductive materials 4, 5 as bonding material so that the LED element 6 is accommodated in the cavity 22a of the second white substrate 22 and the p and n side electrodes on one side opposite to the light emitting surface of the sapphire substrate 6b of the LED element 6 are electrically connected with the through-hole conductors 23, 24. The LED element 6 which is die-bonded on the first white substrate 21 is covered and sealed on its entire periphery with a light transmittable synthetic resin molded portion 8.

The output light which is emitted from the surface of the sapphire substrate 6b of the LED 6 is transmitted through the molded portion 8 and is emitted externally. A part of the output light is reflected on the lateral side of the second white substrate 22. The output light emitted toward one side 6a where the p and n side electrodes are provided on the reverse side opposite to the light emitting face of the LED 6 is also reflected on the first white substrate 21.

In other words, the output light emitted from the LED 6 will be reflected on both the bottom and side of the LED 6 by means of the first and second white substrates 21,22. The reflected light reflected on the first and second white substrates 21, 22 is transmitted through the molded portion 8 and is externally emitted.

Accordingly, since the output light emitted in a direction opposite to the light emitting face of the LED, which has been effectively used is emitted externally as a reflected light, the light emission efficiency can be improved.

The semiconductor light emitting device 20 has no reflector made of an additional member which is formed into a predetermined thickness unlike the prior art and the thickness of the second white substrate can be selected depending upon the thickness of the LED element 6, the elevational size T2 can be made less than that of the prior art. Although the elevational size T1 of the semiconductor light emitting device 11 in the prior art is in order of about 0.5 mm, the elevational size T2 of the semiconductor device of the present invention may be 0.3 mm or less. Accordingly, the semiconductor light emitting device has an advantage that it may be applied to portable products which require reduction in size and weight of the device.

Figure 3:
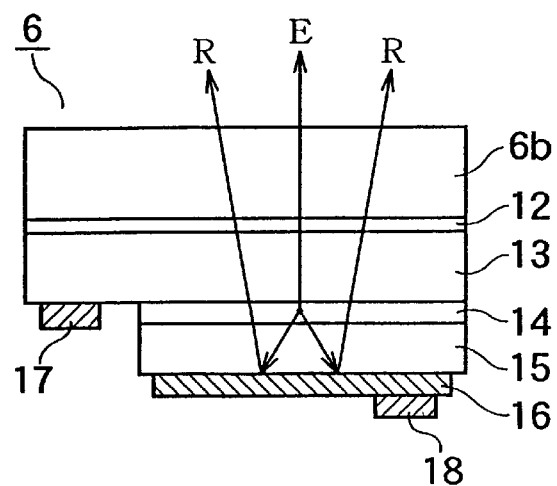
FIG. 3 is a longitudinal front view, partly in section, showing an example of an LED element used for the semiconductor light emitting device of the present invention.

FIG. 3 shows as an example of the semiconductor light emitting element to be used for the light emitting device of the present invention, the semiconductor light emitting element which is disclosed in Japanese Patent Application No. 10-55662 incorporated herein by reference.

A low temperature buffer layer 12 made of GaN is formed on a sapphire substrate 6b and an n type layer 13 is formed on the sapphire substrate 6b. A reference numeral 14 denotes an active layer made of InGaN based compound semiconductor which will serve as a light emitting layer, 15 denotes a p type layer. The n type layer 13, active layer 14 serving as a light emitting layer and the p type layer 15 made of GaN based compound semiconductor are successively formed on the sapphire substrate 6a. A reference numeral 16 denotes a current diffusion film which is formed of an electrically conductive metal having a high light reflectance. The metal having such characteristics may include Al, Ni, Ti, Pt. The current diffusion film 16 which is formed of one of these metals is formed on the p type clad layer 15 in a planar manner. The LED element 6 is mounted on a circuit board so that the output light E of the light emitting layer is emitted from the sapphire substrate 6b. The reflected light R reflected on the current diffusion film 16 is also emitted from the sapphire substrate 6b.

The LED element 6 is mounted on the first white substrate 21 so that the output light is emitted from the light emitting layer on the side facing to the sapphire substrate 6b. On mounting of the LED element 6 on the first white substrate, one side of the LED element 6 on which the n and p side electrodes 17 and 18 are formed is die-bonded on the lead frame or metallized wired first white substrate by using an electrically conductive material as bonding material. By mounting the LED element 6 on the first white substrate 21, a primary light E which is directly emitted from the LED element 6 via the sapphire substrate 6b is added with a reflected light R which is reflected on the current diffusion film 16 so that the resultant light is emitted from the sapphire substrate 6b. In such a type of LED element, a current diffusion film is formed on a p type clad layer for supplying the light emitting layer with a uniform current. In the LED element which is used in the semiconductor light emitting device of the present invention, a metal having a high light reflectance is used so that the current diffusion film is used as a reflector for the output light from the light emitting layer. Therefore, the current diffusion film which otherwise decreases the output light emitting from the prior art LED element can be advantageously utilized as means for increasing the output light emitted from the LED element.

Since the LED element is mounted on the first white substrate 21 in such a manner that the output light from the light emitting layer is reflected on the current diffusion film and is emitted from the sapphire substrate side in accordance with the present invention, the current diffusion film which otherwise decreases the output light from the light emitting layer can be advantageously utilized as means for increasing the output light. The light emission efficiency of the light emitting diode element can be considerably improved.

Accordingly, use of such an LED element enables the light emission efficiency of the semiconductor light emission efficiency by further improved.

In the above-mentioned embodiment of the semiconductor light emitting device 20, the LED element 6 has been described in which the light emitting layer is formed by vapor phase growth of a semiconductor of GaN based compound such as GaN on the substrate 6b made of a light transmittable insulating material having a high hardness such as sapphire and the side of the light emitting layer facing to the substrate 6b serving as a light emitting face.

However, the semiconductor light emitting element which is applied to the semiconductor light emitting device of the present invention is not limited to the LED element having the above-mentioned configuration, but a semiconductor light emitting element in which p and n side electrodes are formed on one side thereof is generally applicable.

What is claimed is:

1. A semiconductor light emitting device comprising:

a first reflective substrate;

a second reflective substrate having cavity which is laminated on said first reflective substrate;

a semiconductor light emitting element which is accommodated in said cavity of said second reflective substrate and is die-bonded on said first reflective substrate on the side opposite to the light emitting side, where p and n side electrodes are formed, said side opposite to the light emitting side comprising a light reflective, current diffusion layer; and a light transmittable synthetic resin molded portion for sealing the semiconductor light emitting element.

2. A semiconductor light emitting device as defined in claim 1, wherein said semiconductor light emitting element is die-bonded on a wiring pattern on the surface of said first reflective substrate facing to the cavity of said second reflective substrate so that the electrodes on the side opposite to the light emitting face of said semiconductor light emitting element are electrically connected to through-hole conductors on said first reflective substrate.

3. A semiconductor light emitting device as defined in claim 2, wherein said first and second reflective substrates are white substrates.

4. A semiconductor light emitting device as defined in claim 1, wherein said semiconductor light emitting element at least comprises a sapphire substrate;

a GaN based compound semiconductor layer including a light emitting layer laminated on said sapphire substrate; and a current diffusion film laminated on said semiconductor layer, and wherein said current diffusion film is made of an electrically conductive metal film having a high light reflectance, and wherein said semiconductor light emitting element is mounted on said first reflective substrate so that an output light of the light emitting layer is emitted from the sapphire substrate together with the reflected light which is reflected on said current diffusion layer.

5. A semiconductor light emitting device as defined in claim 3, wherein said first and second reflective substrates are white substrates.

6. A semiconductor light emitting device as defined in claim 1, wherein said first and second reflective substrates are white substrates.

* * * * *